United States Patent
Dreesen et al.

(10) Patent No.: US 11,688,437 B2
(45) Date of Patent: Jun. 27, 2023

(54) AMPLIFIER OFFSET CANCELATION

(71) Applicant: Apple Inc., Cupertino, CA (US)

(72) Inventors: Michael A. Dreesen, Austin, TX (US); Shawn Searles, Austin, TX (US); Jaemyung Lim, Sunnyvale, CA (US); Jacek R. Wiatrowski, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/481,867

(22) Filed: Sep. 22, 2021

(65) Prior Publication Data

US 2022/0101892 A1 Mar. 31, 2022

Related U.S. Application Data

(60) Provisional application No. 63/083,819, filed on Sep. 25, 2020.

(51) Int. Cl.
*G11C 7/06* (2006.01)
*G11C 7/08* (2006.01)

(52) U.S. Cl.
CPC ............... *G11C 7/08* (2013.01); *G11C 7/065* (2013.01)

(58) Field of Classification Search
CPC ...................................................... G11C 7/08
See application file for complete search history.

(56) References Cited

U.S. PATENT DOCUMENTS

| | | | |
|---|---|---|---|
| 6,586,989 B2 | 7/2003 | Perner et al. | |
| 6,618,305 B2 | 9/2003 | Ernst et al. | |
| 6,965,262 B2 | 11/2005 | Zerbe | |
| 8,619,484 B2* | 12/2013 | Lim | G11C 7/12 |
| | | | 365/207 |
| 9,286,955 B1* | 3/2016 | Stephens, Jr. | H03K 17/6871 |
| 9,384,791 B1* | 7/2016 | Chan | G11C 7/1051 |
| 2006/0152970 A1* | 7/2006 | DeBrosse | G11C 29/026 |
| | | | 365/171 |
| 2015/0162909 A1* | 6/2015 | Bhuiyan | H03K 19/018557 |
| | | | 326/30 |
| 2020/0145599 A1 | 5/2020 | Matsuzaki et al. | |

* cited by examiner

*Primary Examiner* — Min Huang
(74) *Attorney, Agent, or Firm* — Kowert, Hood, Munyon, Rankin & Goetzel, P.C.; Dean M. Munyon

(57) ABSTRACT

An amplifier system includes a differential amplifier and a calibration circuit. In response to a calibration operation, the calibration circuit generates a calibration value based on a test output signal generated by the differential amplifier circuit using a test input signal. The calibration value may be used to adjust loading of internal nodes of the differential amplifier circuit to compensate for imbalance in the differential amplifier circuit resulting from variation in manufacturing. By compensating for the imbalance, the offset of the differential amplifier may be reduced, allowing resolution of smaller differential voltages, thereby improving the performance of circuits employing the differential amplifier circuit.

20 Claims, 9 Drawing Sheets

US 11,688,437 B2

AMPLIFIER OFFSET CANCELATION

PRIORITY INFORMATION

This application claims the benefit of U.S. Provisional Application No. 63/083,819, filed on Sep. 25, 2020, which is incorporated by reference herein in its entirety.

BACKGROUND

Technical Field

This application relates to integrated circuits, and more particularly, to techniques for calibrating amplifier circuits.

Description of the Related Art

Modern computer systems may include multiple circuit blocks designed to perform various functions. For example, such circuit blocks may include processors, processor cores configured to execute software or program instructions. Additionally, the circuit blocks may include memory circuits, input/output circuits, mixed-signal/analog circuits, and the like.

Memory circuit, input/output circuit, and mixed-signal/ analog circuits may include various specialized circuits configured to perform specific functions. These and other types of circuits commonly include amplifier circuits. Generally speaking, an amplifier circuit is configured to amplify either a voltage or current of an input signal to generate an output signal.

There are various types of amplifier circuits. For example, a radio-frequency amplifier circuit may be employed to amplify received radio-frequency signals (e.g., WiFi or cellular signals). Another common type of amplifier circuit employed in computer systems is a differential amplifier circuit, which is configured to amplify a difference between two input signals.

SUMMARY OF THE EMBODIMENTS

Various embodiments of an amplifier calibration system are disclosed. Broadly speaking, an amplifier system includes a differential amplifier circuit, a calibration circuit, and a control circuit. In response to a receiving a calibration signal, the control circuit is configured to generate control signals and a test input signal. The differential amplifier circuit is configured to generate a test output signal using the test input signal. Using the test output signal, the calibration circuit is configured to generate a calibration value. The calibration circuit is further configured to adjust, using the calibration value, the loading on an internal node of the differential amplifier circuit. By adjusting the loading of the internal node, the calibration circuit can compensate for imbalance in the differential amplifier circuit resulting from variations in manufacturing, allowing for the resolution of smaller input differential voltages. With the ability to detect smaller input differential voltages, the performance of circuit employing the differential amplifier circuit may be improved.

BRIEF DESCRIPTION OF THE DRAWINGS

The following detailed description makes reference to the accompanying drawings, which are now briefly described.

DETAILED DESCRIPTION OF EMBODIMENTS

Figure 1:
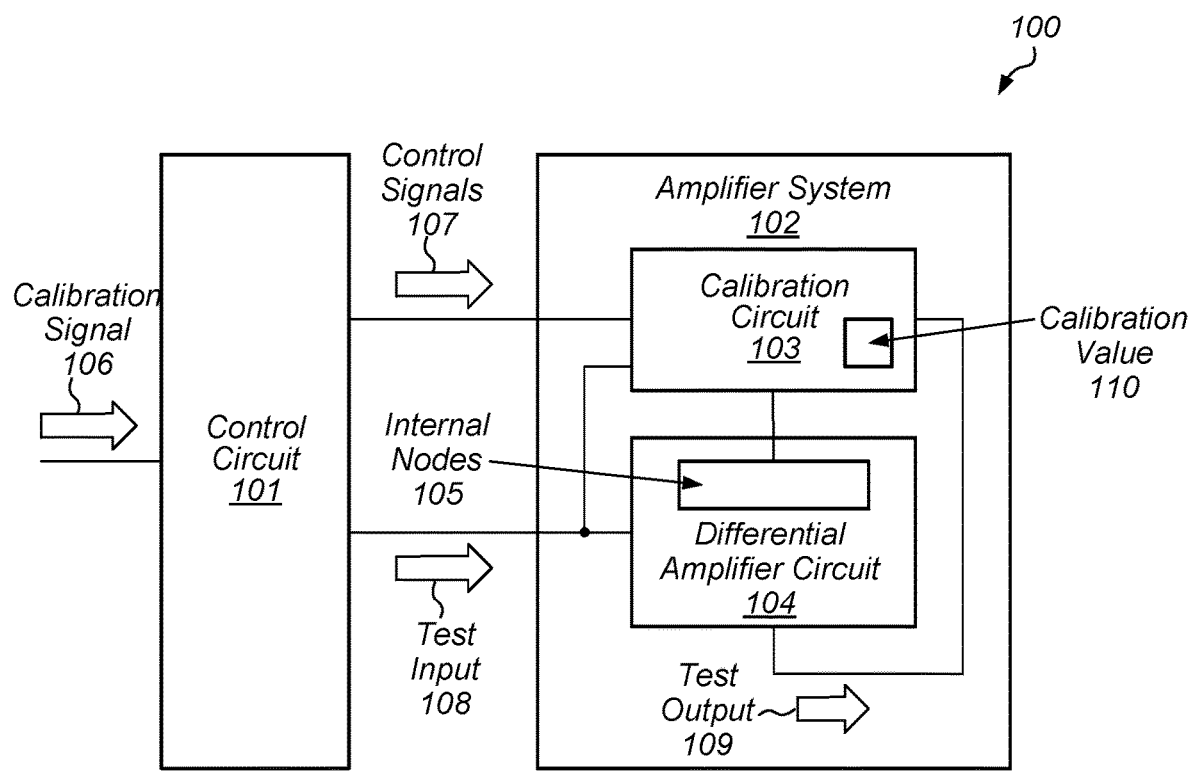
FIG. 1 is a block diagram of an embodiment of an amplifier calibration system.

Computer systems may include various types of amplifier circuits to perform different functions. For example, a computer system may employ an amplifier circuit to increase the power of a radio-frequency signal prior to transmission. In other cases, a computer system may employ amplifier circuits to increase the voltage levels of signals received from sensor circuits or from other input devices.

Various types of amplifier circuit topologies may be employed. One type of commonly used amplifier circuit is a differential amplifier circuit. Such differential amplifier circuits are configured to amplify a difference between two input signals. In some cases, the two input signals may differentially encode information (e.g., a logic value), while in other cases, one of the two input signals may be a reference signal against which the other signal is compared.

When used with signals that differentially encode information, a differential amplifier can be used to amplify a small differential voltage between two input signals in order to create a full-rail digital signal. For example, in a memory circuit, differential amplifier circuits referred to as "sense amplifier circuits" are used to amplify the differential voltage across two bit lines generated by a data storage cell. Such differential voltages are too small to be used with logic gates, so sense amplifier circuits are employed to convert the differential voltages to full-rail signals.

The minimum value of a differential voltage that a sense amplifier circuit can reliably resolve into a logical-1 or a logical-0 is referred to as the "offset" of the sense amplifier circuit. The magnitude of the offset impacts both the amount of energy and the amount of time required to develop the input signal. As noted above, in a memory circuit, a data storage cell generates a differential voltage across two bit lines when the data storage cell is accessed. Initially the differential voltage can be quite small (e.g., a few hundred microvolts), but as time increases, the accessed data storage cell begins to increase the differential voltage. If the offset of a sense amplifier circuit is such that after given time period has elapsed, the differential voltage at that time cannot be reliably resolved into a logic value, additional time needs to be provided to allow the data storage cell to further increase the differential voltage. Such additional time adversely affects the performance of a memory circuit.

The offset associated with a sense amplifier circuit (or any differential amplifier circuit) can be the result of both systemic and random variations within a semiconductor manufacturing process that introduce an imbalance into the sense amplifier circuit. Such imbalances result in different offsets for different sense amplifiers on the same integrated circuit chip, as well as across different integrated circuit chips. For example, different devices with a sense amplifier circuit may receive different levels of dopants during manufacturing, resulting in different threshold voltages that affect the respective input voltages at which these devices activate. Moreover, differences in oxide thickness or metal layer thickness can asymmetrically affect the resistance and capacitances of internal nodes within the sense amplifier circuit, thereby changing the speed with which such internal nodes can charge and discharge.

Since different sense amplifier circuits may have different offsets, the time provided to generate differential voltages during a data storage cell access is commonly set to account for a "worst-case" offset in the sense amplifier circuits within a memory circuit—. This assumption can undesirably increase power consumption and access time of the memory circuit. Techniques described in the present disclosure allow for adjusting the loading of internal nodes in a sense amplifier circuit during a calibration operation. By adjusting the loading of the internal nodes, the imbalance within the sense amplifier circuit can be reduced, allowing the sense amplifier circuit to resolve smaller differential voltages. With the ability to resolve a smaller offset, less time needs to be devoted to differential voltage development, thereby improving performance by decreasing access time, as well as reducing power consumption of a memory circuit.

Turning to FIG. 1, a block diagram of an amplifier calibration system is depicted. As illustrated, amplifier calibration system 100 includes control circuit 101 and amplifier system 102, which includes calibration circuit 103 and differential amplifier circuit 104.

Control circuit 101 is configured, in response to receiving calibration signal 106, to generate control signals 107 and test input 108. In various embodiments, calibration signal 106 activates a calibration operation that includes multiple iterations. As described below, during each of various iterations, test output 109 is checked and adjustments made to differential amplifier circuit 104 to reduce imbalance within differential amplifier circuit 104. The calibration operation may, in various embodiments, be initiated as part of a power-on or startup operation, or may be initiated periodically.

In various embodiments, test input 108 may be a differential signal that encodes data as a difference in the voltage levels of two signals. Control circuit 101 may, in some embodiments, set the differential signal such that the difference in the voltage level of the two signals is less than a threshold value. In some cases, the threshold value may be less than an offset of differential amplifier circuit 104, which allows calibration circuit 103 to observe how the offset affects the operation of differential amplifier circuit 104.

Control circuit 101 may be implemented as a microcontroller, state machine, or any other suitable combination of combinatorial and sequential logic circuits. Although control circuit 101 is depicted as being coupled to a single amplifier system, in other embodiments, control circuit 101 may be coupled to multiple amplifier systems, and may be configured to initiate a calibration operation for the multiple amplifier systems in parallel.

Differential amplifier circuit 104 is configured to generate test output 109 using test input 108. In various embodiments, to generate test output 109, differential amplifier circuit 104 is further configured to amplify a voltage difference included in test input 108. As described below, differential amplifier circuit 104 includes internal nodes 105, and may be designed according to various amplifier circuit topologies. For example, differential amplifier circuit 104 may be a latch-based amplifier circuit. Depending on which of the various amplifier circuit topologies is used to implement differential amplifier circuit 104, test output 109 may be either a differential signal or a single-ended signal.

Calibration circuit 103 is configured to generate a calibration value using test output 109 and test input 108. Calibration circuit 103 is further configured to adjust a load on a selected internal node of internal nodes 105 using calibration value 110. In various embodiments, the selection of which node of internal nodes 105 to adjust may be based on the value of test output 109. By adjusting the load on the selected internal node, the performance of the selected internal node can be adjusted to be similar to other one of internal nodes 105, thereby mitigating imbalance in differential amplifier circuit 104, allowing differential amplifier circuit 104 to resolve smaller differential signals. In the case of memory designs, being able to resolve smaller differential signals may result in faster access times, as well as reducing power dissipation.

It is noted that in some cases, calibration circuit 103 may adjust the load of multiple ones of internal nodes 105. Additionally, in cases where the calibration operation includes multiple iterations, calibration circuit 103 may be configured to adjust respective loads on different ones of internal nodes 105 in different iterations.

As described below, to adjust the load on the selected internal node, calibration circuit 103 may couple one or more capacitors to the selected internal node. In cases where the calibration operation includes multiple iterations, a value of a capacitor coupled to the selected internal node may be based on which iteration of the multiple iterations is being performed. For example, in a first iteration, a first capacitor may be coupled to the selected internal node, and in a second iteration, a second capacitor, whose value is less than the first capacitor, may be coupled to the selected internal node.

Figure 2:
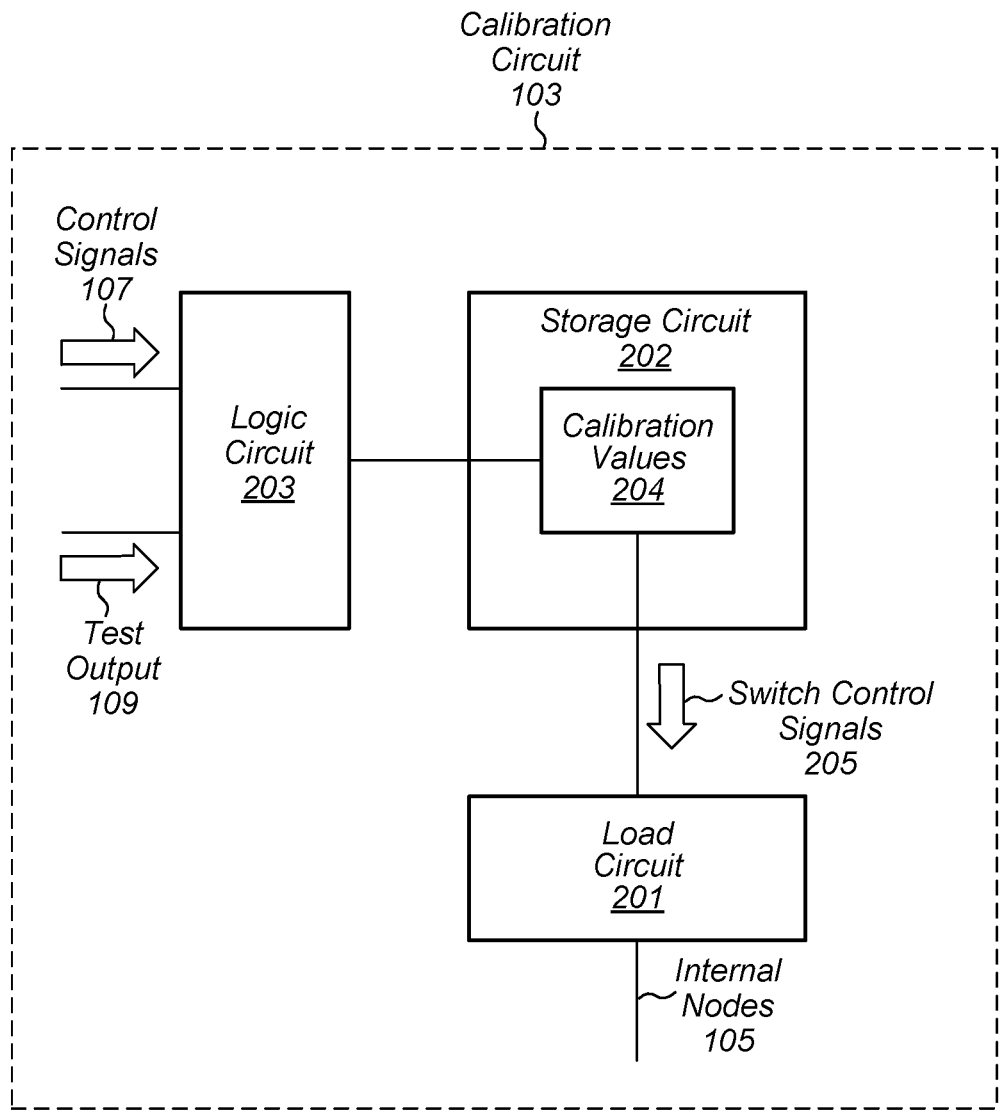
FIG. 2 is a block diagram of an embodiment of a calibration circuit.

Turning to FIG. 2, a block diagram of an embodiment of calibration circuit 103 is depicted. As illustrated, calibration circuit 103 includes load circuit 201, storage circuit 202, and logic circuit 203.

Logic circuit 203 is configured to generate calibration values 204 using control signals 107 and test output 109. It is noted that, in some embodiments, calibration value 110 is included in calibration values 204. In various embodiments, a given one of calibration values 204 may include information indicative of whether to increase or decrease a load on a particular one of internal nodes 105. For example, if test output 109 is a logical-1, logic circuit 203 may set a particular one of calibration values 204 to a logical-1 value. In some cases, different logic values may be encoded in test input 108. In such cases, logic circuit 203 may compare test output 109 to an expected value that is based on a logic value encoded in test input 108 in order to determine a given one of calibration values 204.

As described above, a calibration operation may include multiple iterations. In such cases, logic circuit 203 may generate a corresponding one of calibration values 204 for each iteration. In various embodiments, logic circuit 203 may be implemented using any suitable combination of combinatorial logic gates.

Storage circuit 202 is configured to store calibration values 204. As previously described, different ones of calibration values 204 may correspond to different ones of multiple calibration iterations. In some cases, a single one of calibration values 204 may include multiple bits. In such cases, the multiple bits may be encoded in order to reduce the storage capacitor necessary to store calibration values 204. By storing calibration values 204, storage circuit 202 can maintain the calibration when differential amplifier circuit 104 resumes normal operation after calibration is complete until another calibration operation is performed. In some cases, storage circuit 202 may be implemented using non-volatile data storage cells, allowing the calibration to maintained during power down events.

Storage circuit 202 is further configured to generate switch control signals 205 using calibration values 204. In some cases, a first subset of calibration values 204 may be used to generate a first subset of switch control signals 205 associated with a particular one of internal nodes 105, while a second subset of calibration values 204 may be used to generate a second subset of switch control signals 205 associated with a different one of internal nodes 105. In cases where calibration values are stored in an encoded fashion, to generate switch control signals 205, storage circuit 202 may be further configured to decode calibration values 204.

In various embodiments, storage circuit 202 may be implemented using latch circuits, flip-flop circuits, or any other suitable storage circuit. In some cases, storage circuit 202 may be implemented using magnetoresistive random-access memory (MRAM) storage cells.

Load circuit 201 is configured to add respective amounts of capacitance to different ones of internal nodes 105 based on switch control signals 205. As noted above, there may be multiple sources of imbalance within differential amplifier circuit 104. By adding capacitance to different ones of internal nodes 105, imbalance within differential amplifier circuit 104 may be reduced by changing respective time constants of different ones of internal nodes 105. For example, a time constant of an internal node coupled to a device with a large transconductance can be increased by adding additional capacitance to compensate for the device's large transconductance.

Figure 3:
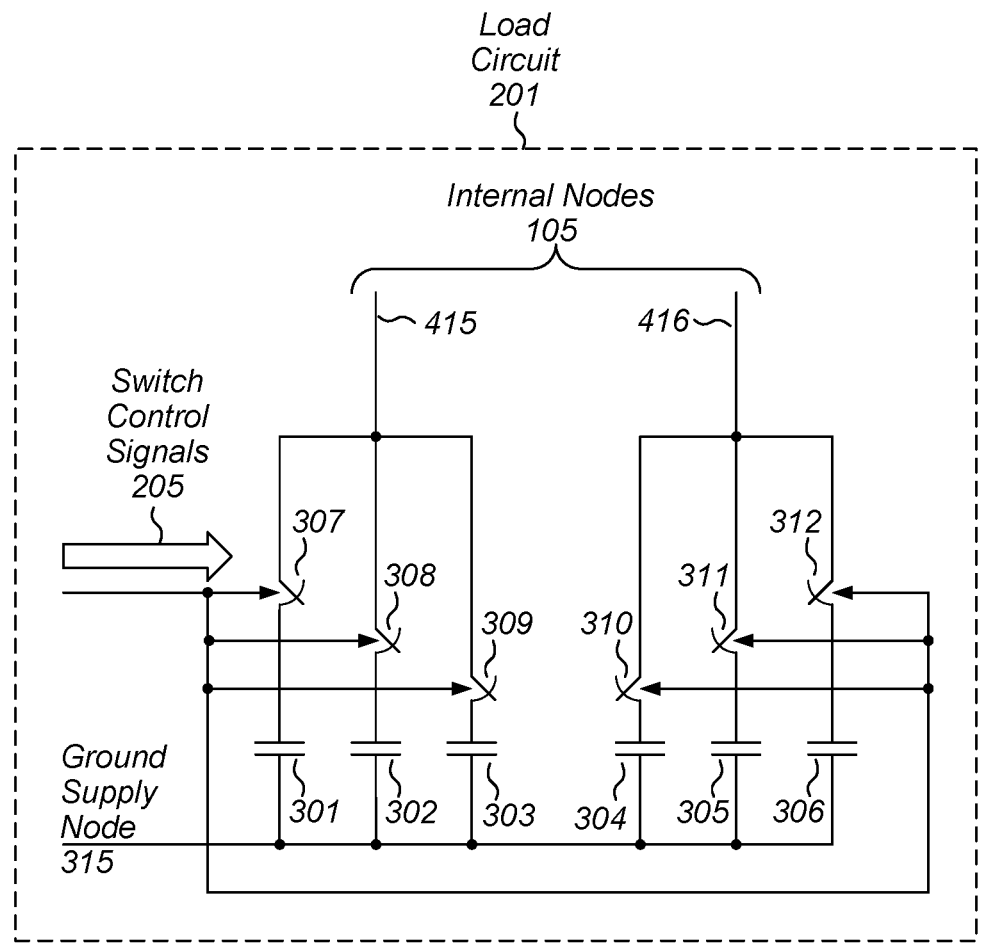
FIG. 3 is a block diagram of an embodiment of a load circuit.

Various circuit topologies may be employed to adjust the capacitive load on internal nodes 105. One such approach includes coupling capacitors to different ones of internal nodes 105 based on the calibration values 204. A block diagram of a load circuit that employs such a technique is depicted in FIG. 3. As illustrated, load circuit 201 includes capacitors 301-306 and switches 307-312.

Switches 307-309 are coupled between node 415 and capacitors 301-303, respectively. In a similar fashion, switches 310-312 are coupled between node 416 and capacitors 304-306, respectively. In various embodiments, nodes 415 and 416 are included in internal nodes 105. It is noted that although six capacitors and six switches are depicted in the embodiment of FIG. 3, in other embodiments, any suitable number of capacitors and switches may be employed.

Switches 307-309 are configured to couple node 415 to capacitors 301-303, respectively, based on corresponding ones of switch control signals 205. In a similar fashion, switches 310-312 are configured to couple node 416 to capacitors 304-306, respectively, based on corresponding ones of switch control signals 205. By coupling different ones of capacitors 301-303 to node 415, and different ones of capacitors 304-306 to node 416, imbalance in differential amplifier circuit 104 may be reduced.

In various embodiments, the values of capacitors 301-303 and 304-306 may be weighted. For example, a value of capacitor 302 may be half of a value of capacitor 301, generating a binary-weighted set of values. By employing capacitors of different weights, a magnitude of change associated with each calibration iteration can be different, going from a coarse adjustment to a fine adjustment, allowing for flexibility in reducing the imbalance.

Capacitors 301-306 may be implemented as metal-oxide-metal (MOM) capacitors, metal-insulator-metal (MIM) capacitors, or any other suitable capacitor structure available on a semiconductor manufacturing process. In other embodiments, capacitors 301-306 may be implemented using gate oxides of metal-oxide semiconductor field-effect transistors (MOSFETs).

Switches 307-312 may be implemented as pass gates that include one or more MOSFETs, or any other suitable switch structure configured to couple one circuit node to another circuit node based on a value of a control signal. In some embodiments, such pass gates may be implemented using both p-channel and n-channel MOSFETs. In such cases, a given switch control of switch control signals 205 may include true and complement versions of the given switch control signal to control the n-channel MOSFET and the p-channel MOSFET, respectively.

Figure 4:
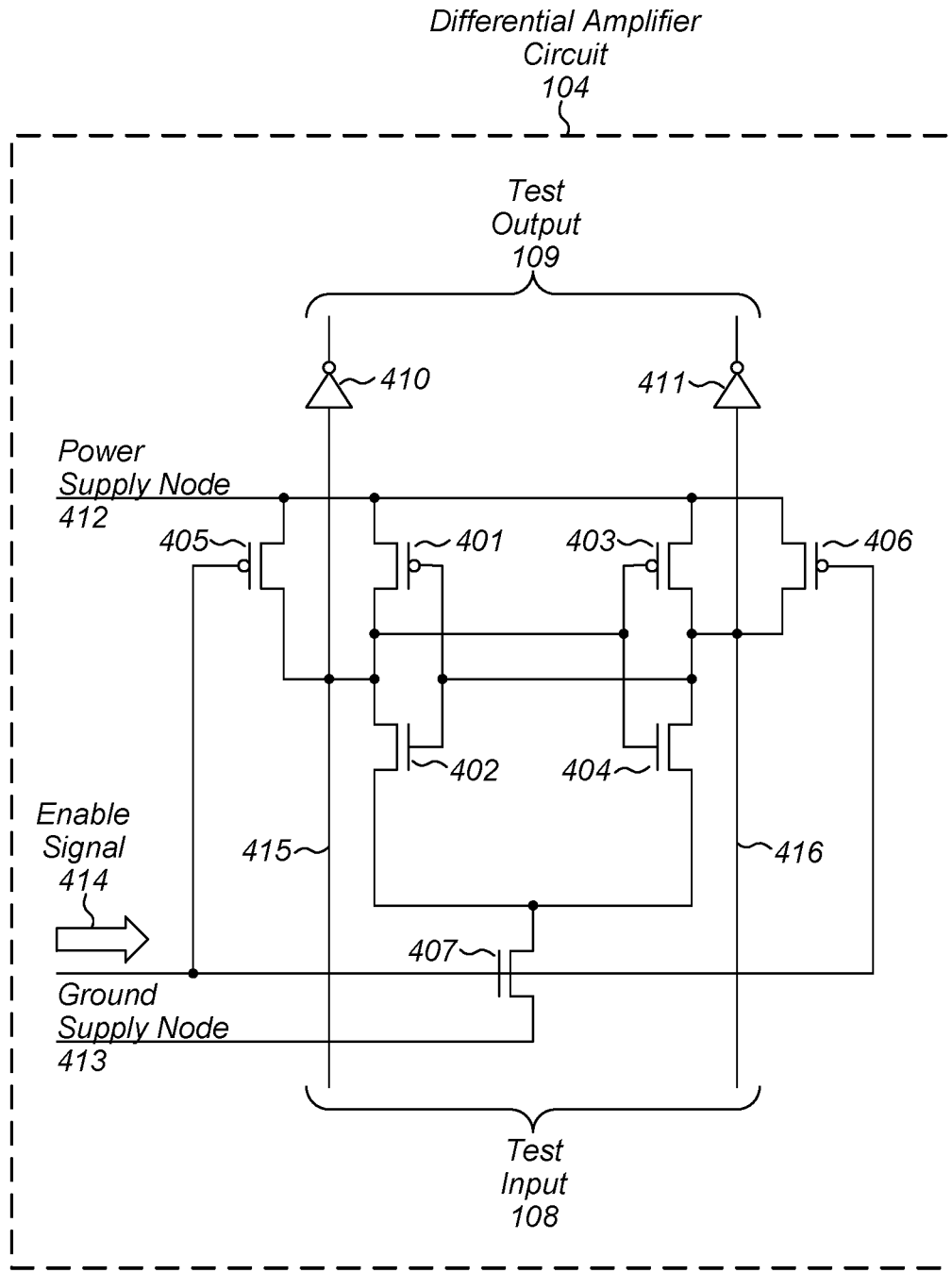
FIG. 4 is a block diagram of a differential amplifier circuit.

There are numerous circuit techniques for implementing a differential amplifier. Some differential amplifiers employ a pair of matching devices (referred to as a "differential pair") that are biased at a common mode operating point based on the common mode of a differential input signal. Other differential amplifiers, such as those used in memory circuits as sense amplifiers, are latch based. The techniques for calibrating such amplifier circuits may be applied to any suitable differential amplifier circuit topology. A block diagram of a latch-based differential amplifier circuit is depicted in FIG. 4. As illustrated, differential amplifier circuit 104 includes devices 401-407, and inverters 410 and 411.

Devices 401 and 403 are coupled between power supply node 412 and nodes 415 and 416, respectively. In various embodiments, nodes 415 and 416 are included in internal nodes 105 and may be used as node to inject test input 108 into differential amplifier circuit 104. It is contemplated that, in other embodiments, additional nodes included in differential amplifier circuit 104 may be included in internal nodes 105. For example, in some embodiments where test input 108 is coupled to control nodes of input devices (referred to as "gate-fed amplifier circuits"), internal nodes 105 may include nodes between the input devices and devices 402 and 404.

Devices 402 is coupled between device 407 and node 415, while device 404 is coupled between device 407 and node 416. Control terminals of devices 401 and 402 are coupled to node 416, while control terminals of devices 403 and 404 are coupled to node 415. It is noted that devices 401 and 402 form a first inverter circuit, and devices 403 and 404 form a second inverter circuit. The first and second inverter circuits are arranged in a cross-coupled fashion to form a latch circuit. Device 407 is also coupled to ground supply node 413. A control terminal of device 407 is coupled to enable signal 414.

Devices 405 and 406 are coupled between power supply node 412 and nodes 415 and 416, respectively. Control terminals of devices 405 and 406 are coupled to enable signal 414. Inputs of inverters 410 and 411 are coupled to nodes 415 and 416, respectively. Outputs of inverters 410 and 411 are coupled to test output 109. It is noted that inverters 410 and 411 may be implemented as complementary metal-oxide semiconductor (CMOS) inverters or any other suitable inverting amplifier circuit including those fabricated with technologies other than CMOS.

When differential amplifier circuit 104 is inactive, enable signal 414 is at a logical-0 value, activating devices 405 and 406, which pre-charges nodes 415 and 416 to a voltage level of power supply node 412. Once test input signal 108 has been applied to differential amplifier circuit 104, enable signal 414 is set to a logical-1 value, de-activating devices 405 and 407, while activating device 407. Once activated, device 407 couples devices 402 and 404 to ground supply node 413.

The differential voltage of test input 108 causes one of devices 402 or 404 to conduct more than the other, resulting in one of nodes 415 or 416 to be a lower voltage than the other. The regenerative feedback formed by devices 401-404, amplifies the difference in the voltage levels of nodes 415 and 416, until one node is close to the voltage level of power supply node 412 and the other is close to ground potential. Inverters 410 and 411 generate test output 109 using the voltage levels of nodes 415 and 416, respectively.

As described above, the regenerative feedback generated by devices 401-404 is important to the amplification of test input 108. Ideally, devices 401 and 403 should have similar electrical characteristics, as should devices 402 and 404. Additionally, the respective capacitances of nodes 415 and 416 should be the same (within a tolerance value). As noted above, however, during manufacturing differences in the aforementioned electrical characteristics and capacitance values can be introduced. Such differences in electrical characteristics can result in an imbalance within differential amplifier circuit 104, causing it to preferentially tend towards a particular output value. When the differential voltage input to differential amplifier circuit 104 is sufficiently small, differential amplifier circuit is not able to resolve the difference in voltage levels, and produces an output based on the imbalance in the circuit.

By adding capacitance to either of nodes 415 or 416, the performance of differential amplifier circuit 104 can be adjusted to compensate for the differences in the electrical characteristics of devices 401-404. For example, if node 416 tends to discharge more quickly than node 415, additional capacitance can be added to node 416 so that it behaves more similar to node 415. By adjusting the respective loads of nodes 415 and 416, the imbalance of differential amplifier circuit 104 can be reduced, allowing it to detect smaller differential voltages.

Devices 401, 403, 405, and 406 may be implemented as p-channel MOSFETs or other suitable transconductance devices. In a similar fashion, devices 402, 404, and 407 may be implemented as n-channel MOSFETs or other suitable transconductance devices.

Figure 5:
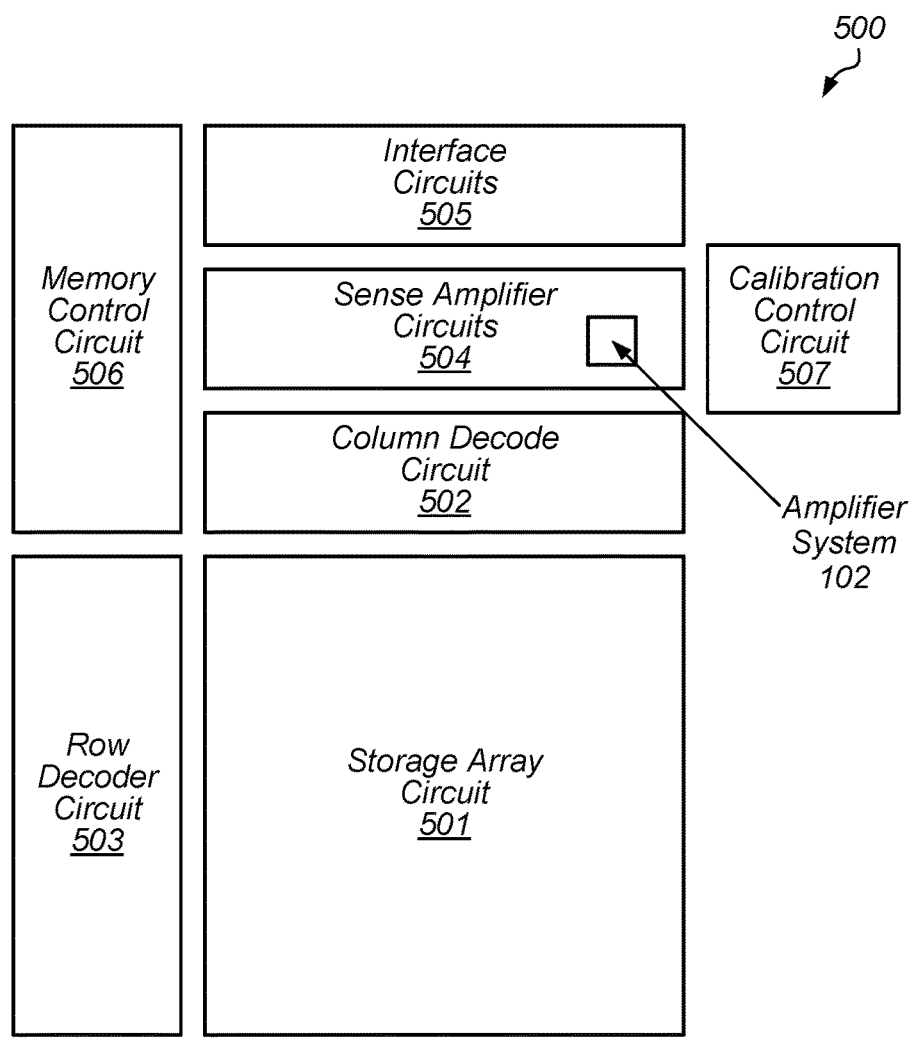
FIG. 5 is a block diagram of a memory circuit.

As mentioned above, the disclosed calibration techniques may be applied to various differential amplifier circuit topologies, which may be used in different situations. For example, latched-based differential amplifier circuits are often employed in memory circuits to amplify small differential voltage levels generated by data storage cells. A block diagram of an embodiment of a memory circuit that employs the disclosed calibration techniques is depicted in FIG. 5. As illustrated, memory circuit 500 includes storage array circuit 501, column decode circuit 502, row decoder circuit 503, sense amplifier circuits 504, interface circuits 505, memory control circuit 506, and calibration control circuit 507.

Storage array circuit 501 includes a plurality of data storage cells (not shown) arranged in rows and columns, such that a given data storage cell is coupled to a corresponding word line and a corresponding pair of bit lines. Each of the data storage cells is configured to store information (e.g., a voltage level, an amount of charge, etc.) indicative of one or more bits. In response to being activated, a given data storage cell is configured to generate a differential voltage on its corresponding bit line pair.

Row decoder circuit 503 is configured to activate a subset of data storage cells included in storage array circuit 501. In various embodiments, the data storage cells included in the subset of data storage cells are coupled to a common word line that is selected based on an address signal.

Column decoder circuit 502 is configured to selectively couple a given bit line pair of a subset of the bit line pairs in storage array circuit 501 to a corresponding sense amplifier circuit of sense amplifier circuits 504. In various embodiments, the selection of which bit line pair to couple to the corresponding sense amplifier circuit is based on the address signal.

Sense amplifier circuits 504 include multiple instances of amplifier system 102, which is configured to perform any or all of the operations as depicted in FIGS. 1-4. In various embodiments, sense amplifier circuits 504 may be calibrated individually, in groups, or in parallel. It is noted that in some embodiments, storage circuit 202 may be co-located with each amplifier system 102 included in sense amplifier circuits 504. In other embodiments, a single common storage circuit may be employed and stored calibration values routed to individual ones of sense amplifier circuits 504.

Memory control circuit 506 is configured to generate various timing and control signals (e.g., a sense amplifier enable signal) internal to memory circuit 500. In various embodiments, memory control circuit 506 may generate the timing and control signals using an external clock signal and an external mode signal that specifies a read or write operation (both not shown). During calibration operations, memory control circuit 506 may be inactive to avoid interfering the with calibration operations.

Interface circuits 505 are configured to receive, from an external source, data to be stored in memory circuit 500. Additionally, interface circuits 505 are configured to transmit data received from sense amplifier circuits 504. In some cases, interface circuit 505 may also be configured to level shift received signals and transmit signals to be compatible with requirements of a communication bus coupled to memory circuit 500.

In various embodiments, calibration control circuit 507 may correspond to control circuit 101 as depicted in FIG. 1. Calibration control circuit 507 may be configured to activate a calibration operation on sense amplifier circuits 504 in response to receiving a calibration request. The calibration operation may include any or all of the features of the calibration operation described in regards to FIGS. 1-4. In some embodiments, calibration control circuit 507 may periodically initiate the calibration operation, or may initiate the calibration operation in response to an environmental change (e.g., temperature) or other suitable event. In some cases, calibration control circuit 507 may initiate the calibration operation as part of a power-on or startup operation of memory circuit 500. It is noted that during read and write operations to memory circuit 500, calibration control circuit 507 may be inactive, with the exception of timing or other bookkeeping operations used to track when calibration operations are to be performed.

Figure 6:
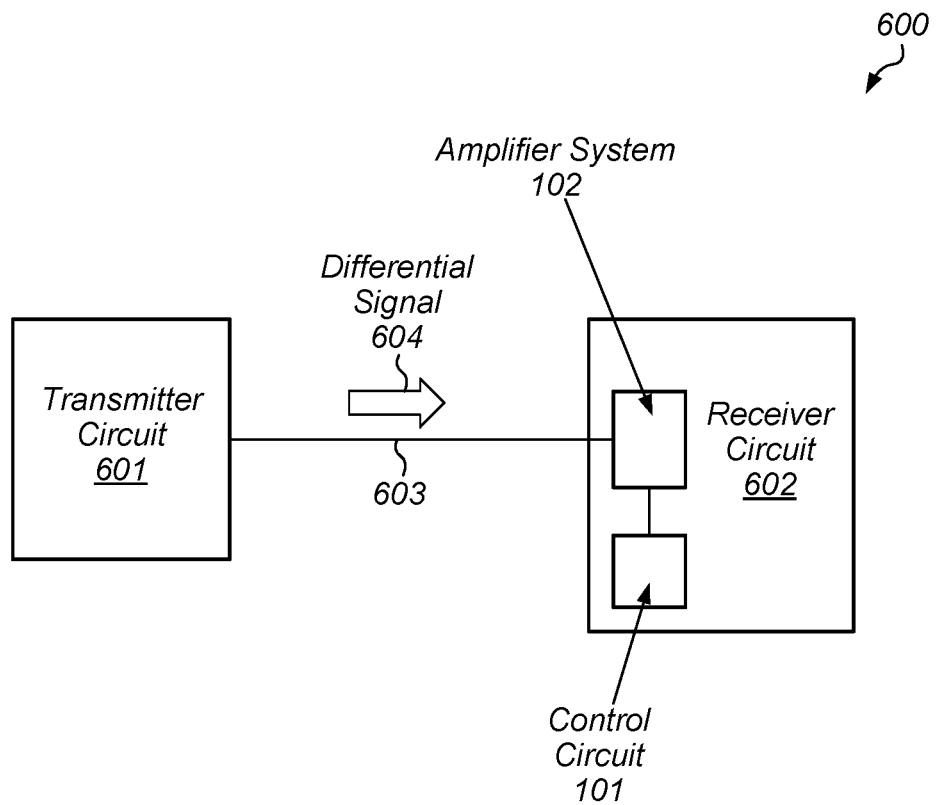
FIG. 6 is a block diagram of a communication sub-system of a computer system.

In some computer systems, data is transmitted using differential signaling. In such cases, a single bit is represented as a difference in the voltage level of two signals. Often, such data is transmitted in a serial fashion over a communication channel, and a receiver circuit senses the difference between the two voltage levels, using a differential amplifier, to determine the values being transmitted. The duration of a given bit (often referred to as a "symbol") is based on how quickly the differential amplifier can resolve the difference in voltage levels. Any imbalance in the differential amplifier can result in longer symbol durations, limiting the bandwidth of the communication channel. A block diagram of a portion of a communication sub-system included in a computer system is depicted in FIG. 6. As illustrated, communication sub-system 600 includes transmitter circuit 601 and receiver circuit 602, which includes amplifier system 102 and control circuit 101.

Transmitter circuit 601 is configured to transmit differential signal 604 via communication channel 603. Differential signal 604 may, in some embodiments, include two signals that differentially encode bit values. In various embodiments, communication channel 603 may include multiple wires, some of which are employed for transmitting differential signal 604, and others of which are employed as shielding to reduce crosstalk or other noise from coupling into communication channel 603. It is noted that communication channel 603 may be either synchronous or asynchronous.

Receiver circuit 602 is configured to receive differential signal 604 via communication channel 603 and determine bit values encoded in differential signal 604. In some cases, receiver circuit 602 may employ additional circuits (not shown) configured to perform clock-data recovery and other signal processing on the output of amplifier system 102.

As described above, control circuit 101 is configured to perform calibration operations on amplifier system 102 to reduce imbalance within the differential amplifier included in amplifier system 102. In some cases, control circuit 101 may initiate such calibration operations as part of a power-on, startup, or training routine of communication sub-system 600. Alternatively, control circuit 101 may periodically initiate the calibration operation after a particular time period has elapsed since a previous calibration operation.

Figure 7:
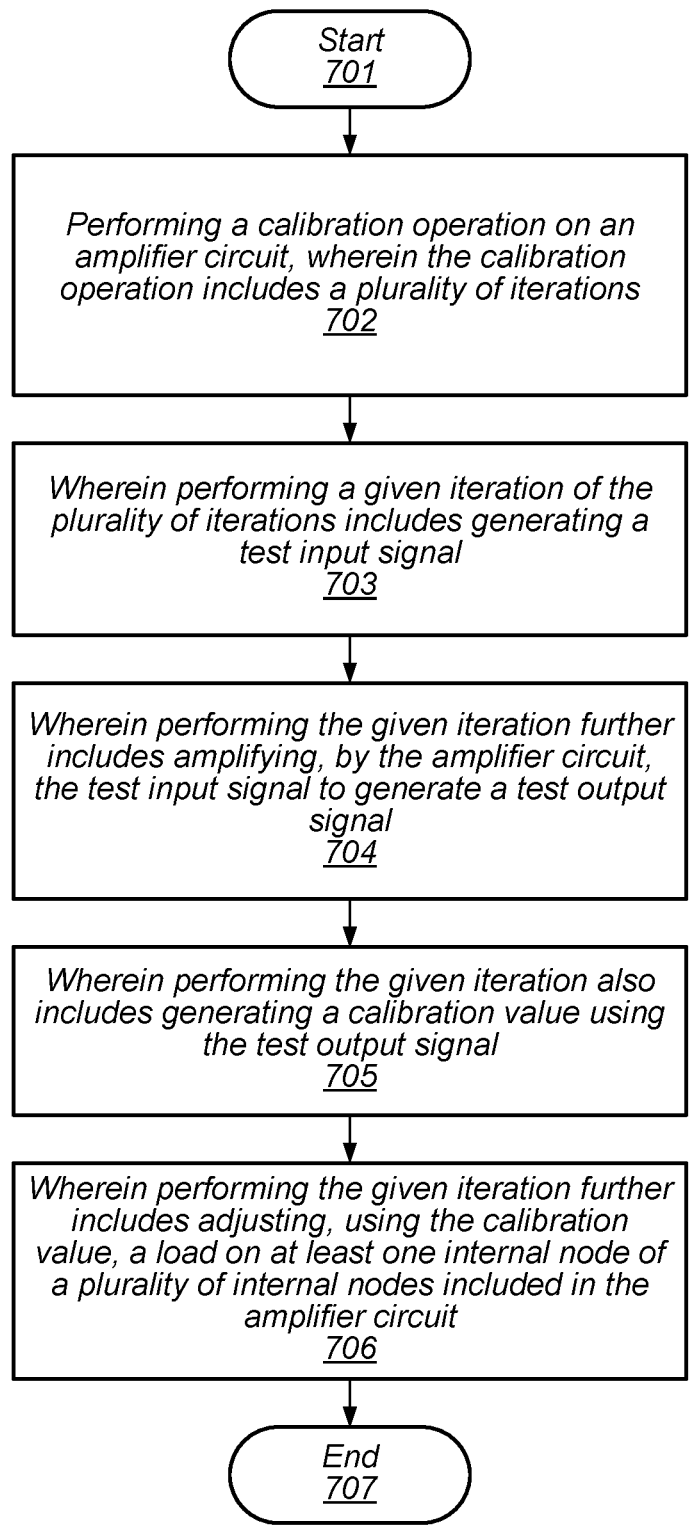
FIG. 7 depicts a flow diagram illustrating an embodiment of a method for calibrating a different amplifier circuit.

Turning to FIG. 7, a flow diagram depicting an embodiment of a method for calibrating a differential amplifier circuit is illustrated. The method, which begins in block 701, may be applied to various differential amplifier circuits, such as differential amplifier circuit 104 as illustrated in FIG. 1.

The method includes performing a calibration operation on an amplifier circuit, wherein the calibration operation includes a plurality of iterations (block 702). In some embodiments, the amplifier circuit includes a differential amplifier circuit configured to amplify a difference between two input signals to generate an output signal. The calibration operation may be performed during a power-on or startup routine associated with a computer system. In other embodiments, the calibration operation may be performed after a particular time period has elapsed or after the amplifier has been used a particular number of times.

In various embodiments, performing a given iteration of the plurality of iterations includes generating a test input signal (block 703). In some cases, the test input signal is a differential signal that includes a first input signal and a second input signal that differentially encode a test value. In other embodiments, the first input signal and the second input signal may both be set to a voltage level that is within a threshold level of a voltage level of a power supply node coupled to the amplifier circuit.

In some embodiments, performing the given iteration includes amplifying, by the amplifier circuit, the test input signal to generate a test output signal (block 704). In some cases, amplifying the test input signal includes activating the amplifier circuit using an enable signal. The method may also include, upon completing generating the test output signal, de-activating the amplifier circuit, and pre-charging the amplifier circuit to prepare it for a subsequent activation.

In other embodiments, performing the given iteration includes generating a calibration value using the test output signal (block 705). The method may also include storing the calibration value. In some cases, the calibration value may be stored in a latch circuit, a flip-flop circuit, or any other suitable storage circuit.

In various embodiments, performing the given iteration includes adjusting, using the calibration value, a load on a particular internal node of a plurality of internal nodes included in the amplifier circuit (block 706). It is noted that in some cases, the load on more than one node may be adjusted. In some cases, adjusting the load on the particular internal node of the plurality of internal nodes includes coupling a particular capacitor of a plurality of capacitors to the particular internal node. In various embodiments, a value of the particular capacitor is twice a value of a different capacitor of the plurality of capacitors. By sizing the capacitors in this fashion, adjustments to the loading can be performed in a binary-weighted fashion. The most-significant-bit of the calibration value controls the coupling of a largest one of the plurality of capacitors and each subsequent bit of the calibration controls the coupling of progressively smaller capacitors. Such an approach offers a wide range of loading that can be applied to an internal node.

In some embodiments, coupling the particular capacitor includes generating one or more switch control signals using the calibration value, and closing a switch using the one or more switch control signals, where the switch is coupled between the particular internal node and the particular capacitor. The method concludes in block 707.

Figure 8:
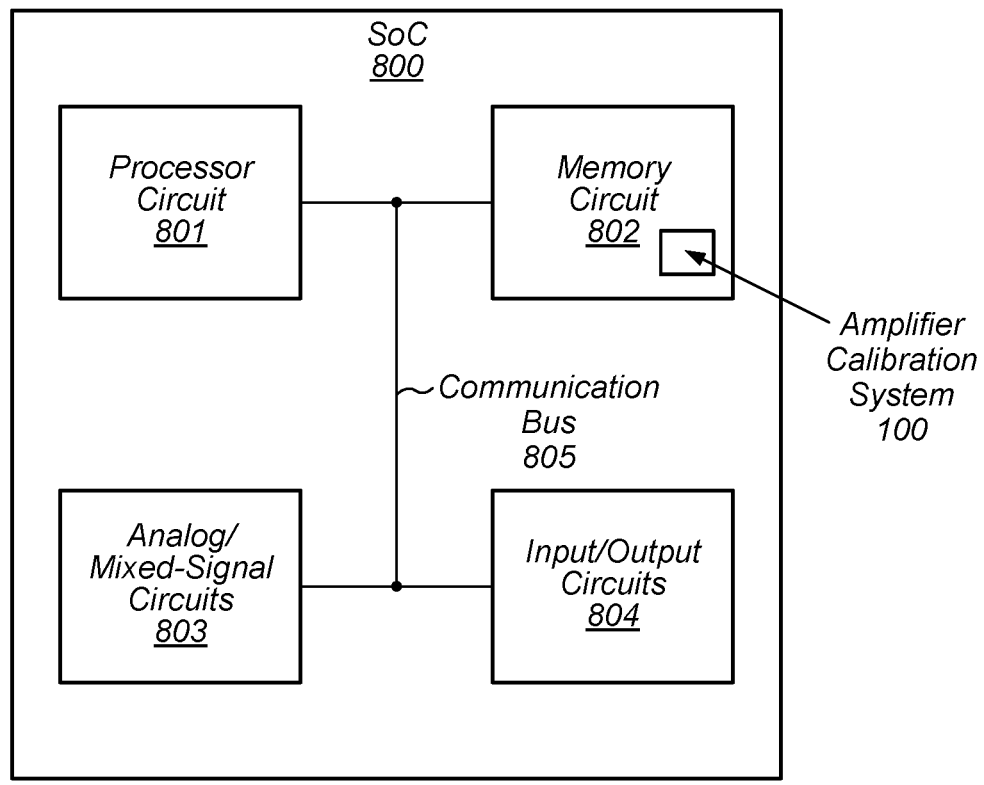
FIG. 8 illustrates a block diagram of a system-on-a-chip.

A block diagram of a system-on-a-chip (SoC) is illustrated in FIG. 8. In the illustrated embodiment, the SoC 800 includes processor circuit 801, memory circuit 802, analog/mixed-signal circuits 803, and input/output circuits 804, each of which is coupled to communication bus 805. In various embodiments, SoC 800 may be a system-on-a-chip (SoC) and/or be configured for use in a desktop computer, server, or in a mobile computing application such as, e.g., a tablet, laptop computer, or wearable computing device.

Processor circuit 801 may, in various embodiments, be representative of a general-purpose processor that performs computational operations. For example, processor circuit 801 may be a central processing unit (CPU), a graphics processing unit (GPU), a microcontroller, or the like, and may be implemented as an application-specific integrated circuit (ASIC), a field-programmable gate array (FPGA), etc. In some embodiments, processor circuit 801 may interface to memory circuit 802, analog/mixed-signal circuits 803, and input/output circuits 804 via communication bus 805.

Memory circuit 802 includes amplifier calibration system 100, may in various embodiments, be implemented as any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 8, in other embodiments, any suitable number of memory circuits may be employed.

Analog/mixed-signal circuits 803 includes a variety of circuits such as phase-locked loop circuits, digital-to-analog converter circuits, crystal oscillator circuits, and the like. In other embodiments, analog/mixed-signal circuits 803 may be configured to perform power management tasks with the inclusion of on-chip power supplies and voltage regulators.

Input/output circuits 804 may be configured to coordinate data transfer between SoC 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 may also be configured to coordinate data transfer between SoC 800 and one or more devices (e.g., other computing systems or integrated circuits) coupled to SoC 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Figure 9:
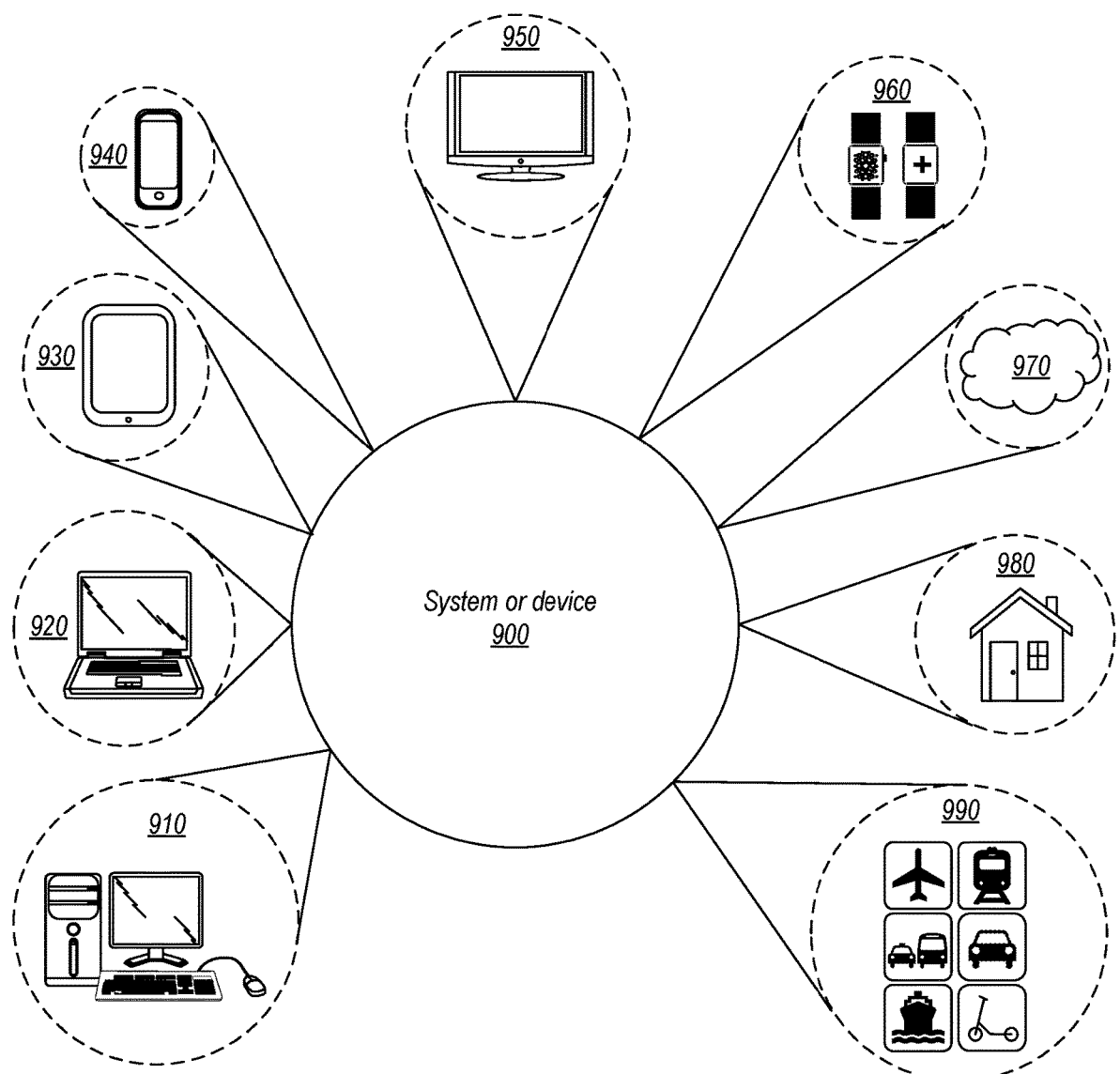
FIG. 9 illustrates a block diagram of a computer system.

Turning now to FIG. 9, various types of systems that may include any of the circuits, devices, or system discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
a control circuit configured, in response to receiving a calibration signal, to generate a plurality of control signals and a test input signal; and
a differential amplifier circuit that includes a plurality of internal nodes, wherein the differential amplifier circuit is configured to generate a test output signal using the test input signal; and
a calibration circuit that includes a plurality of capacitors and a plurality of switches, wherein the calibration circuit is configured to:
generate a calibration value using the test output signal;
generate one or more switch control signals using the calibration value; and
close, using the one or more switch control signals, a particular switch of the plurality of switches that is coupled between at least one internal node of the plurality of internal nodes and a particular capacitor of the plurality of capacitors to adjust a load on the at least one internal node.

2. The apparatus of claim 1, wherein the calibration circuit includes a local storage circuit configured to store the calibration value to maintain calibration until a next calibration operation.

3. The apparatus of claim 1, wherein respective values of the plurality of capacitors are weighted in a binary fashion.

4. The apparatus of claim 1, wherein to determine the calibration value, the calibration circuit is further configured to compare the test output signal to an expected output signal whose value is based on the test input signal.

5. A method, comprising:
performing, on an amplifier circuit, a calibration operation that includes a plurality of iterations, and wherein performing a given iteration of the plurality of iterations includes:
generating a test input signal;
amplifying, by the amplifier circuit, the test input signal to generate a test output signal;
generating a calibration value using the test output signal;
generating one or more switch control signals using the calibration value; and
closing a switch using the one or more switch control signals to couple a particular capacitor of a plurality of capacitors to at least one internal node of a plurality of internal nodes included in the amplifier circuit to adjust a load on the at least one internal node, wherein the switch is coupled between the at least one internal node and the particular capacitor.

6. The method of claim 5, further comprising maintaining the calibration until a next calibration operation by storing the calibration value in a storage circuit included in the amplifier circuit.

7. The method of claim 5, wherein respective values of the plurality of capacitors are weighted in a binary fashion.

8. The method of claim 5, wherein the test input signal includes a first input signal and a second input signal that differentially encode a test value.

9. The method of claim 5, wherein the calibration value includes a plurality of bits whose value encodes a number of capacitors to couple to the at least one internal node.

10. An apparatus, comprising:
a plurality of data storage cells configured to:
store respective information indicative of corresponding logic values; and
in response to being accessed, generate respective differential voltage levels based on the respective information;
a plurality of sense amplifier circuits configured to amplify corresponding differential voltage levels generated by respective ones of the plurality of data storage cells; and
a calibration control circuit configured to perform a calibration operation, in parallel, on the plurality of sense amplifier circuits; and
wherein a given sense amplifier circuit that includes a plurality of capacitors and a plurality of switches, and wherein the given sense amplifier circuit is configured to:
generate a test output signal using a test input signal;
determine a calibration value using the test output signal;
generate one or more switch control signals using the calibration value; and
close, using one or more switch control signals, a particular switch of the plurality of switches that is coupled between at least one internal node of a plurality of internal nodes included in the sense amplifier circuit and a particular capacitor of the plurality of capacitors to adjust a load on the at least one internal node.

11. The apparatus of claim 10, wherein the given sense amplifier circuit is further configured to store the calibration value, and amplify a given differential voltage generated by a particular data storage cell of the plurality of data storage cells with an internal load based on the stored calibration value.

12. The apparatus of claim 10, wherein to determine the calibration value, the given sense amplifier circuit is further configured to compare the test output signal to an expected output signal whose value is based on the test input signal.

13. The apparatus of claim 10, wherein respective values of the plurality of capacitors are weighted in a binary fashion, and wherein the calibration value includes a plurality of bits, and wherein the calibration control circuit is further configured to couple the particular capacitor of the plurality of capacitors using a corresponding bit of the plurality of bits.

14. The apparatus of claim 13, wherein the calibration operation includes a plurality of iterations, and wherein the given sense amplifier circuit is further configured to:

generate, during a first iteration of the plurality of iterations, a first test output signal using the test input signal;
determine a first calibration value using the first test output signal;
couple, using the first calibration value, a first capacitor of the plurality of capacitors to a first internal node of the plurality of internal nodes;
generate, during a second iteration of the plurality of iterations, a second test output signal using the test input signal, wherein the second iteration is performed subsequent to the first iteration;
determine a second calibration value using the second test output signal; and
couple, using the second calibration value, a second capacitor of the plurality of capacitors to a second internal node of the plurality of internal nodes, wherein a value of the second capacitor is different than a value of the first capacitor.

15. The apparatus of claim 2, wherein the local storage circuit includes a plurality of magnetoresistive random-access memory storage cells configured to store the calibration value.

16. The apparatus of claim 1, wherein to generate the test output signal, the differential amplifier circuit is configured to apply, based on the test input signal, a differential voltage across a first internal node of the plurality of internal nodes and a second internal node of the plurality of internal nodes.

17. The method of claim 6, wherein the storage circuit included in the amplifier circuit includes a plurality of magnetoresistive random-access memory storage cells.

18. The method of claim 8, wherein the amplifier circuit includes a first internal node and a second internal node, and wherein amplifying the test input signal includes applying the first input signal to the first internal node and applying the second input signal to second internal node.

19. The apparatus of claim 11, wherein the given sense amplifier circuit further includes a plurality of magnetoresistive random-access memory storage cells configured to store the calibration value.

20. The apparatus of claim 10, wherein the given sense amplifier circuit includes a plurality of internal nodes and, wherein to generate the test output signal, the given sense amplifier circuit is further configured to apply a differential voltage, based on the test input signal, across a first internal node of the plurality of internal nodes and a second internal node of the plurality of internal nodes.

* * * * *